United States Patent
Hofer et al.

(10) Patent No.: US 6,828,772 B1
(45) Date of Patent: Dec. 7, 2004

(54) ROTATING GRIPPER WAFER FLIPPER

(75) Inventors: Willard L. Hofer, Boise, ID (US); Shawn D. Davis, Meridian, ID (US); Joe L. Phillips, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 499 days.

(21) Appl. No.: 09/593,358

(22) Filed: Jun. 14, 2000

(51) Int. Cl.[7] .............................................. G01R 31/02
(52) U.S. Cl. ................... 324/158.1; 324/765; 324/754
(58) Field of Search ................................ 324/765, 754, 324/158.1, 72.5, 758, 761, 769, 760, 763; 414/796, 225, 744.5, 217, 256; 118/62; 294/119.1, 103.1, 87.1; 901/39, 15, 30; 451/334, 339

(56) References Cited

U.S. PATENT DOCUMENTS

| | | | | |
|---|---|---|---|---|
| 5,052,884 A | * | 10/1991 | Igari | 414/744.2 |
| 5,518,542 A | * | 5/1996 | Matsukawa et al. | 118/52 |
| 5,549,444 A | * | 8/1996 | Dubuit | 414/796 |
| 5,700,046 A | * | 12/1997 | VanDoren et al. | 294/119.1 |
| 5,868,857 A | * | 2/1999 | Moinpour et al. | 134/6 |
| 5,947,802 A | * | 9/1999 | Zhang et al. | 414/225 |
| 6,168,683 B1 | * | 1/2001 | Cesna | 156/345 |
| 6,186,873 B1 | * | 2/2001 | Becker et al. | 451/54 |
| 6,350,097 B1 | * | 2/2002 | Mitchell et al. | 414/217 |
| 6,283,701 B1 | * | 9/2002 | Sundar et al. | 414/744.5 |
| 6,606,154 B1 | * | 8/2003 | Oda | 356/244 |

OTHER PUBLICATIONS

Ultracision, Inc. "Inspection Gimbal Assembly" Mar. 19, 1999.
Olympus "Inspection and Transfer System" 1999.
Nikon "Inspection and Transfer System" 1999.
Ontrak Systems "Synergy Performa" Mar. 19, 1999.
Ontrak Systems "Synergy Integra" Mar. 19, 1999.

* cited by examiner

Primary Examiner—Kamand Cuneo
Assistant Examiner—Jimmy Nguyen
(74) Attorney, Agent, or Firm—Fletcher Yoder (57) ABSTRACT

A method and apparatus for inspecting semiconductor wafers. Specifically, an arm which is constructed to hold a wafer, is mounted on a rotational device to provide a user with the means of inspecting a wafer in any position without having to physically touch the wafer or move the wafer to another inspection station. The arm provides rotation about an axis parallel to the surface of the wafer, as well as rotation about an axis run which is perpendicular to the surface of the wafer and extends through the axial center of the wafer.

7 Claims, 11 Drawing Sheets

ROTATING GRIPPER WAFER FLIPPER

BACKGROUND OF THE INVENTION

1. Field of the Invention

The present invention relates generally to integrated circuit fabrication and, more particularly, to the inspection of semiconductor wafers.

2. Background of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Integrated circuits are generally mass produced by fabricating thousands of identical circuit patterns on a single semiconductor wafer and subsequently dividing them into identical die or chips. Semiconductor wafers are generally made of silicon. To produce the integrated circuit, many commonly known processes are used to modify, remove, and deposit material onto the semiconductor wafer. Processes such as ion implantation, sputtering, etching, chemical vapor deposition and variations thereof are among those processes commonly used. These processes are often selectively applied to an integrated circuit through the use of a masking process. In the masking process, a photomask containing the pattern of the structure to be fabricated is created, and the wafer is coated with a photolithographic material, generally a photoresist. Next, the resist-coated wafer is exposed to ultraviolet light through a photomask to soften or harden parts of the resist, depending on whether a positive or negative photoresist is used. Once the softened parts of the photoresist are removed, the wafer is treated by one of the processes discussed above to modify, remove, or replace the part unprotected by the photoresist, and then the remaining photoresist is stripped from the semiconductor wafer. The masking process permits specific areas of the integrated circuit to be modified, removed, or replaced.

An integrated circuit device is built in three major steps of the wafer fabrication process. In the first step, the active and passive parts are fabricated in and on the wafer surface. The last step comprises a series of steps which are used to cover the completed chip surface with a protective layer. The step in between consists of the processes that put one or more layers of conducting metal on the wafer surface and the patterning process that leaves the circuit components electrically connected.

Once the integrated circuit has been built on the silicon wafer, the wafer is evaluated and electrically tested to determine which integrated circuit die are good so that they may be packaged for use. One of the fundamental methods of evaluating the semiconductor wafer is to inspect the wafer optically for any visible anomalies. By physically inspecting the wafer surface, an operator may detect processing pattern flaws or isolated anomalies which may be corrected to increase the yield of usable integrated circuit die on the semiconductor wafer. Inspection stations containing a surface to hold the wafer, magnifying devices, and lights are common in the wafer manufacturing process.

Traditionally, a semiconductor wafer is placed in a wafer carrier, such as a wafer boat or wafer cassette. At various points in the processing, the wafers are physically removed from the wafer carrier by an operator and placed on an inspection device. Often times, the wafer must be manually rotated to inspect the entire wafer adequately. Next, the wafer is either flipped so that the backside may be inspected at the same workstation, or the wafer may be transferred to another inspection station to inspect the backside of the wafer. Either way, there is more physical handling of the wafer by operators. Each time the wafer is physically handled by an operator, the chances of damaging the wafer increase. Semiconductor wafers are often chipped, cracked, scratched, or broken due to operator handling errors. Unfortunately, conventional inspection of the semiconductor wafer necessitates the physical handling of the semiconductor wafer to manipulate the wafer to examine all areas and both sides of the wafer. What is needed is an inspection device which will allow an operator to inspect all areas and both sides of the wafer with minimal handling of the wafer.

The present invention may address one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided an apparatus for inspecting a disc-like substrate. The apparatus includes a holding structure having members arranged to hold and rotate the substrate about a first axis. The holding structure is connected to a rotatable member which is configured to rotate the holding structure about a second axis different from the first axis.

In accordance with another aspect of the present invention, there is provided a method of inspecting a semiconductor wafer comprising the acts of: loading the substrate into a holding structure, the substrate having a first surface and a second surface; inspecting the first surface of the substrate by rotating the substrate within the holding structure about a first axis, the first axis disposed generally perpendicular to the surface of the substrate and extending generally through the axial center of the substrate; rotating the holding structure about a rotatable member to rotate the substrate approximately 180° about a second axis, the rotatable member being mechanically coupled to the holding structure; inspecting the second surface of the substrate; and removing the substrate from the holding structure.

In accordance with yet another aspect of the present invention, there is provided a method of fabricating an integrated circuit package comprising the acts of: disposing a plurality of integrated circuit devices onto a silicon wafer, inspecting the wafer by: loading the wafer into a wafer holding structure, the wafer having a first surface and a second surface; inspecting the first surface of the wafer by rotating the wafer within the wafer holding structure about a first axis, the first axis disposed generally perpendicular to the surface of the wafer and extending generally through the axial center of the wafer; rotating the wafer holding structure about a rotatable member to rotate the wafer approximately 180° about a second axis, the rotatable member being mechanically coupled to the wafer holding structure; inspecting the second surface of the wafer, and removing the wafer from the wafer holding structure; electrically testing the integrated circuit devices; singulating the integrated circuit devices; and packaging selected singulated integrated circuit to form respective integrated circuit packages.

BRIEF DESCRIPTION OF THE DRAWINGS

The foregoing and other advantages of the invention will become apparent upon reading the following detailed description and upon reference to the drawings in which.

DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
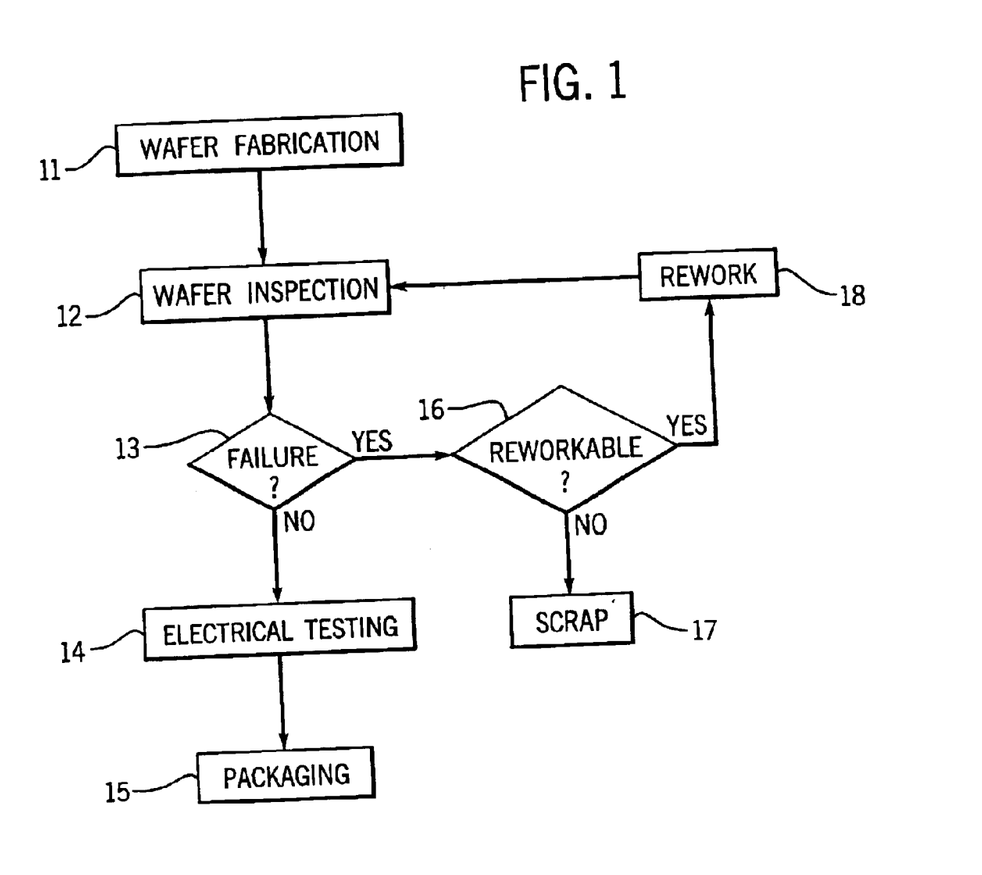
FIG. 1 illustrates an exemplary process flow for building an I/C device.

An integrated circuit device is generally built on a wafer following a flow similar to that illustrated in FIG. 1. First, a substrate material, such as silicon, is provided for wafer fabrication (block 11). Wafer fabrication generally includes the fabrication of active and passive parts on the wafer surface and the deposition of one or more layers of conductive material which is patterned to electrically connect all of the active circuit components. The wafer is then generally covered with a protective material such as a polyamide. Next, the frontside, backside, and edges of the wafer may be inspected visually (block 12). Advantageously, the present invention may facilitate an optimal method for inspecting the wafer. Generally, wafer inspection is performed by human operators. However, the present invention may be useful in conjunction with an optical sensor, which may be used to inspect a wafer without human operators. During wafer inspection, the wafer is inspected for visual anomalies (block 13). If there are no visual failures, the wafer may be tested for electrical failures (block 14). The good integrated circuit devices may then be singulated, commonly by a saw process, and then packaged for use in a system (block 15). If there are visual failures at inspection, it is determined whether the wafer may be re-workable (block 16). If the anomaly is not re-workable, the wafer is generally scrapped (block 17). If it is determined that the wafer may be re-workable, the wafer is generally sent to be re-worked to correct the anomaly (block 18). Once the wafer is re-worked, it may be sent back for visual inspection (block 12) once again.

Figure 2:
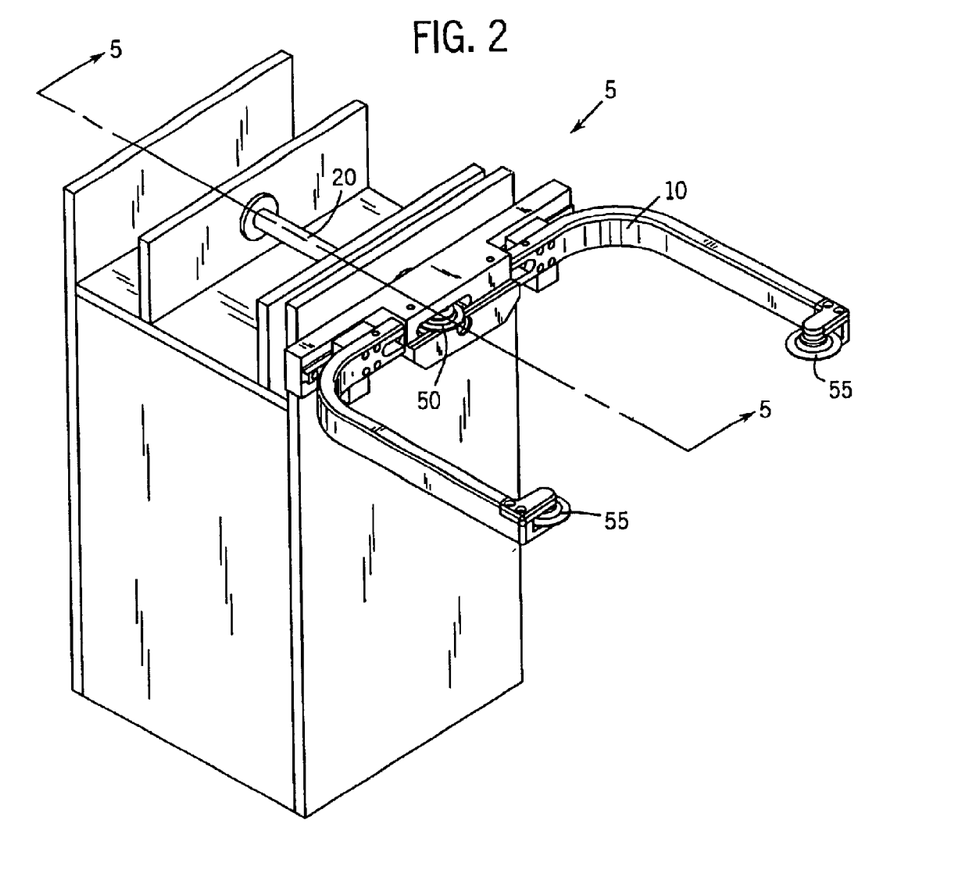
FIG. 2 illustrates a perspective view of a rotating gripper wafer flipper.

The present embodiment may be particularly useful during wafer inspection (block 12). FIG. 2 illustrates a perspective view of one embodiment of a rotating gripper wafer flipper apparatus 5 according to the present invention. Generally, the apparatus 5 includes a rotating gripper assembly which comprises a wafer holding structure 10 and a flipper shaft 20. The wafer holding structure 10 is mechanically coupled to the flipper shaft 20. The wafer holding structure 10 is configured to hold a disc-like substrate, such as a semiconductor wafer for inspection. Indeed, as apparent from the following discussion, the wafer holding structure 10 may be constructed so that it may hold semiconductor wafers of differing diameters.

Figure 4:
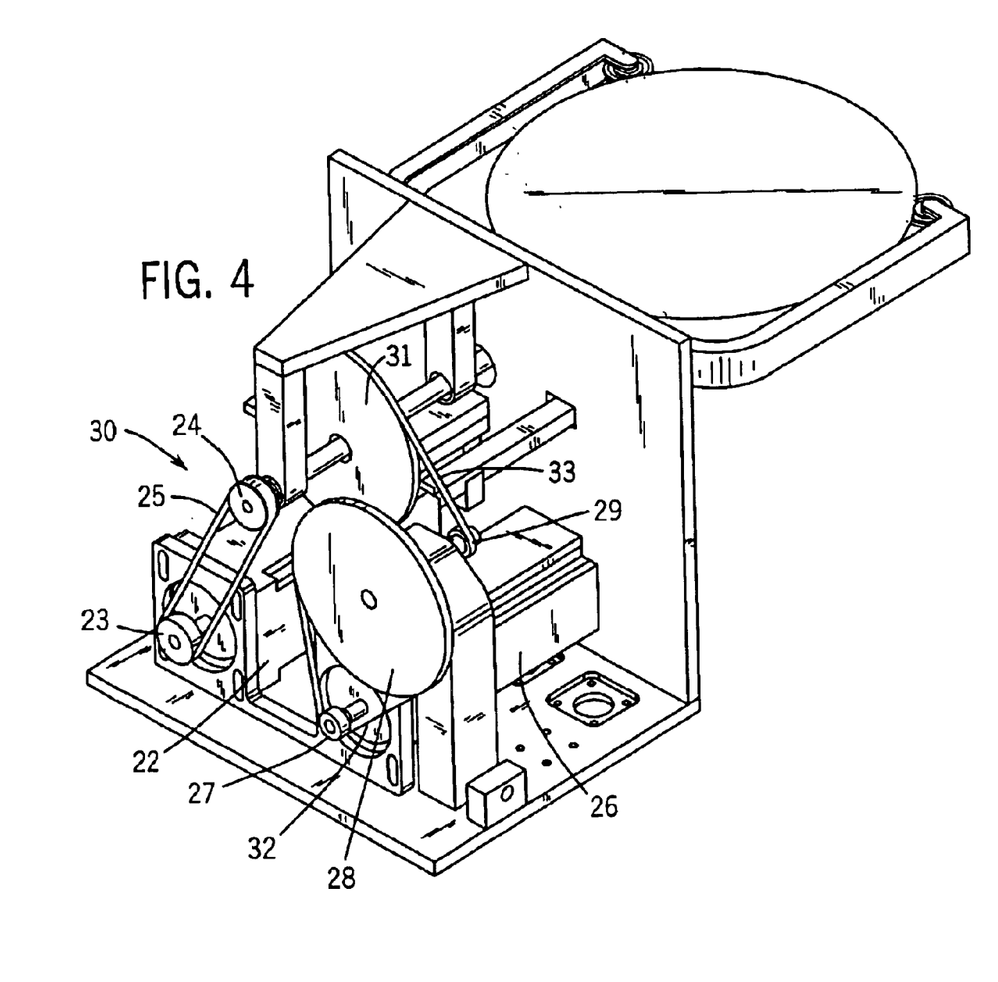
FIG. 4 illustrates one embodiment of a motor assembly in accordance with the present invention.

In one embodiment, the flipper shaft 20 is connected to a motor assembly, discussed herein with reference to FIG. 4. The flipper shaft 20 may be connected to the motor assembly in any suitable manner, such as by a series of pulleys (not shown). The motor assembly provides a mechanism for flipping the wafer, at least 180° and advantageously 360°, about the flipper shaft 20. As the motor assembly rotates the flipper shaft 20, the wafer holding structure 10 and thus the wafer rotates about the flipper shaft 20.

Figure 3:
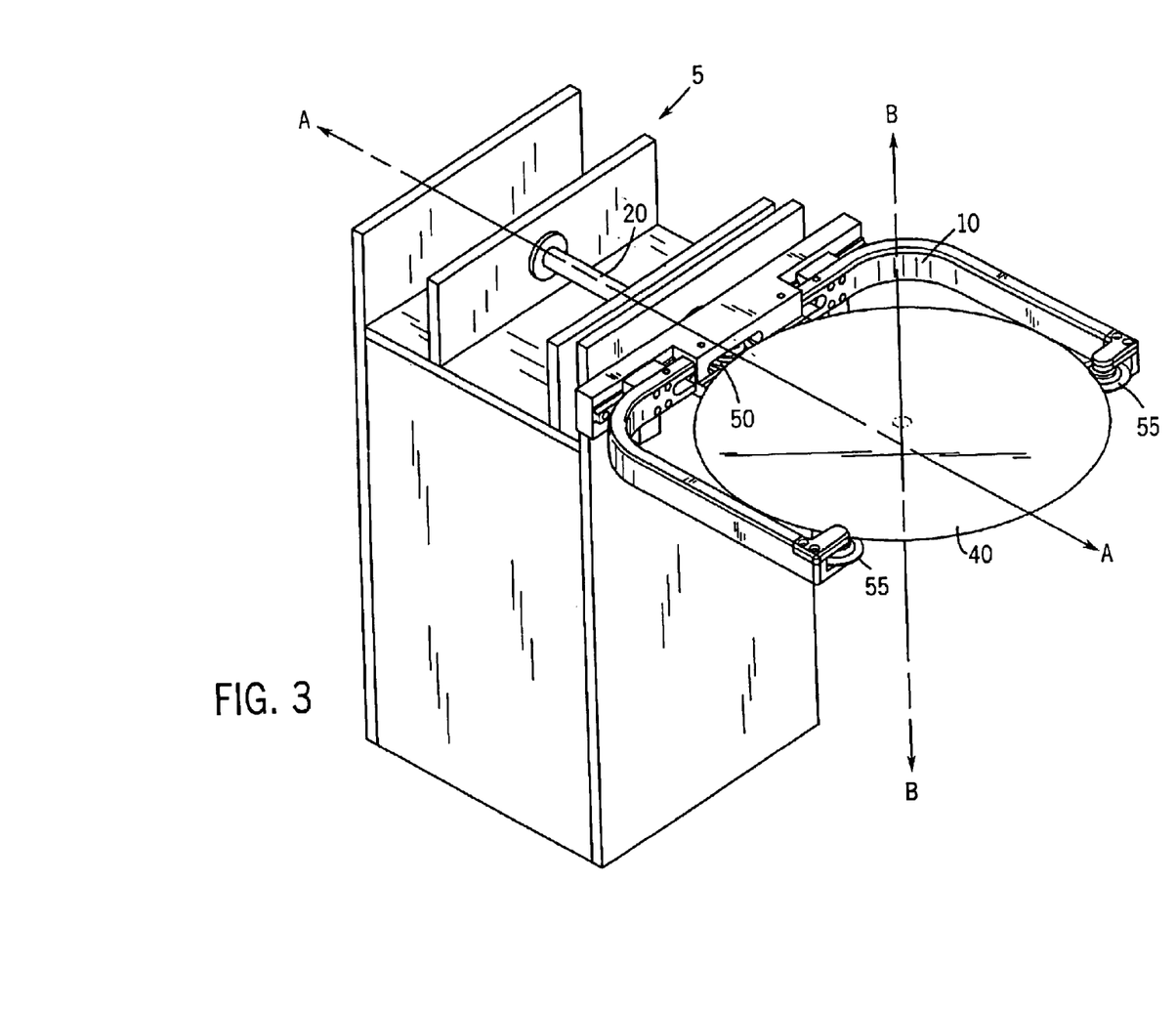
FIG. 3 illustrates a perspective view of the rotating gripper wafer flipper illustrated in FIG. 2 with a semiconductor wafer loaded in the gripper arms and illustrating the rotational axis.

FIG. 3 illustrates the apparatus 5, as shown in FIG. 2, with a semiconductor wafer 40 mounted on the wafer holding structure 10. Again, the wafer holding structure 10 is mechanically coupled to the flipper shaft 20 whose rotation is driven by the motor assembly. As the motor assembly turns the flipper shaft 20 and the wafer holding structure 10, the semiconductor wafer 40 is permitted to rotate about the axis A—A. By rotating the semiconductor wafer 40 about the axis A—A, an operator inspecting the wafer 40 can examine the frontside and the backside of the semiconductor wafer 40 at any desired angle, without removing the semiconductor wafer 40 from the apparatus 5.

The semiconductor wafer 40 is held securely in place by a plurality of wedge assemblies 50 and 55. Here, the wafer holding structure 10 contains three wedge assemblies to hold the semiconductor wafer 40 securely in place as it rotates about the axis A—A. Each wedge assembly 50 and 55 contains a V-shaped slot in which the semiconductor wafer 40 can be deposited. The V-shaped slot in the wedge assembly 50 and 55 advantageously contains a rubber material, such as Tygon, to secure the semiconductor wafer 40 within each wedge assembly 50 and 55. Also, one wedge assembly, here the center wedge assembly 50 (hereinafter referred to as the "drive wheel wedge assembly 50"), may be coupled to a motor assembly (shown in FIG. 4), which rotates the drive wheel wedge assembly 50. Rotation of the drive wheel wedge assembly 50 causes the semiconductor wafer 40 to rotate about an axis B—B disposed generally perpendicular to the surface of the semiconductor wafer 40 and extending generally through the axial center of the semiconductor wafer 40. The remaining wedge assemblies 55 in this exemplary embodiment are idler wheel wedge assemblies 55 which freely rotate as the semiconductor wafer 40 is rotated by the drive wheel wedge assembly 50.

One embodiment of the motor assembly 30 is illustrated in FIG. 4. The motor assembly 30 may be comprised of two stepper motors, one to control the flipping and the other to control rotation of the wafer 40, as shown here. However, a single motor may be used to control both the flipping and rotation of the wafer 40. Any type of motor which may be configured to provide incremental, non-continuous rotation of a shaft, such as a brushless DC motor or a permanent magnet motor, may be used. In this embodiment, a pitch motor 22 is configured to turn the flipper shaft 20 to rotate the semiconductor wafer 40, 360° about the axis A—A (illustrated in FIG. 3). Flipper drive pulleys 23 and 24 may be driven by a motor belt 25 which operatively connects the pitch motor 22 to the flipper shaft 20. The rotational drive motor 26 permits rotation of the wafer 40 about the axis B—B (illustrated in FIG. 3). Rotational drive pulleys 27, 28, 29, and 31 are operatively connected between the rotational drive motor 56 and the rotational drive shaft (not shown) by motor drive belts 32 and 33.

While a motorized assembly to control the movement of the apparatus 5 has been described, it should be clear that a non-motorized flipper assembly may also be used. Instead of the flipper shaft 20 being coupled to a motor assembly 30, the flipper shaft 20 or the gripper arms 60 may have an appendage attached thereto, such as a handle (not shown), which will permit manual pitch movement of the wafer about the axis A—A. Also, a thumb wheel (not shown) may be present in the gripper arms 60 to permit rotation of the wafer generally about the axis B—B. In other words, virtually any mechanism which will permit rotation of the gripper arms 60 about the axis A—A and permit rotation of the wafer about the axis B—B may be used.

Figure 5A:
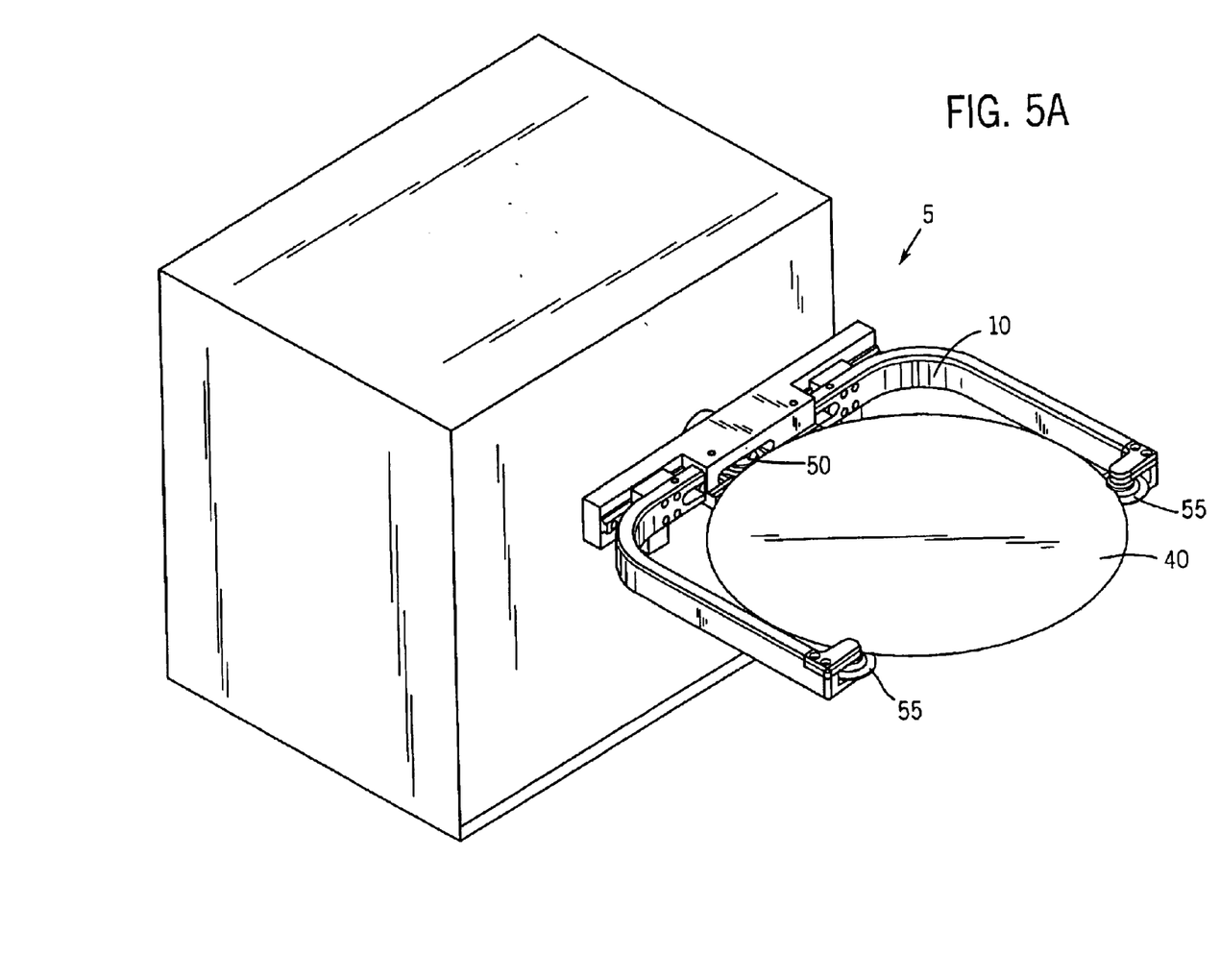
FIGS. 5A, 5B and 5C illustrate a flipping sequence.
Figure 5B:
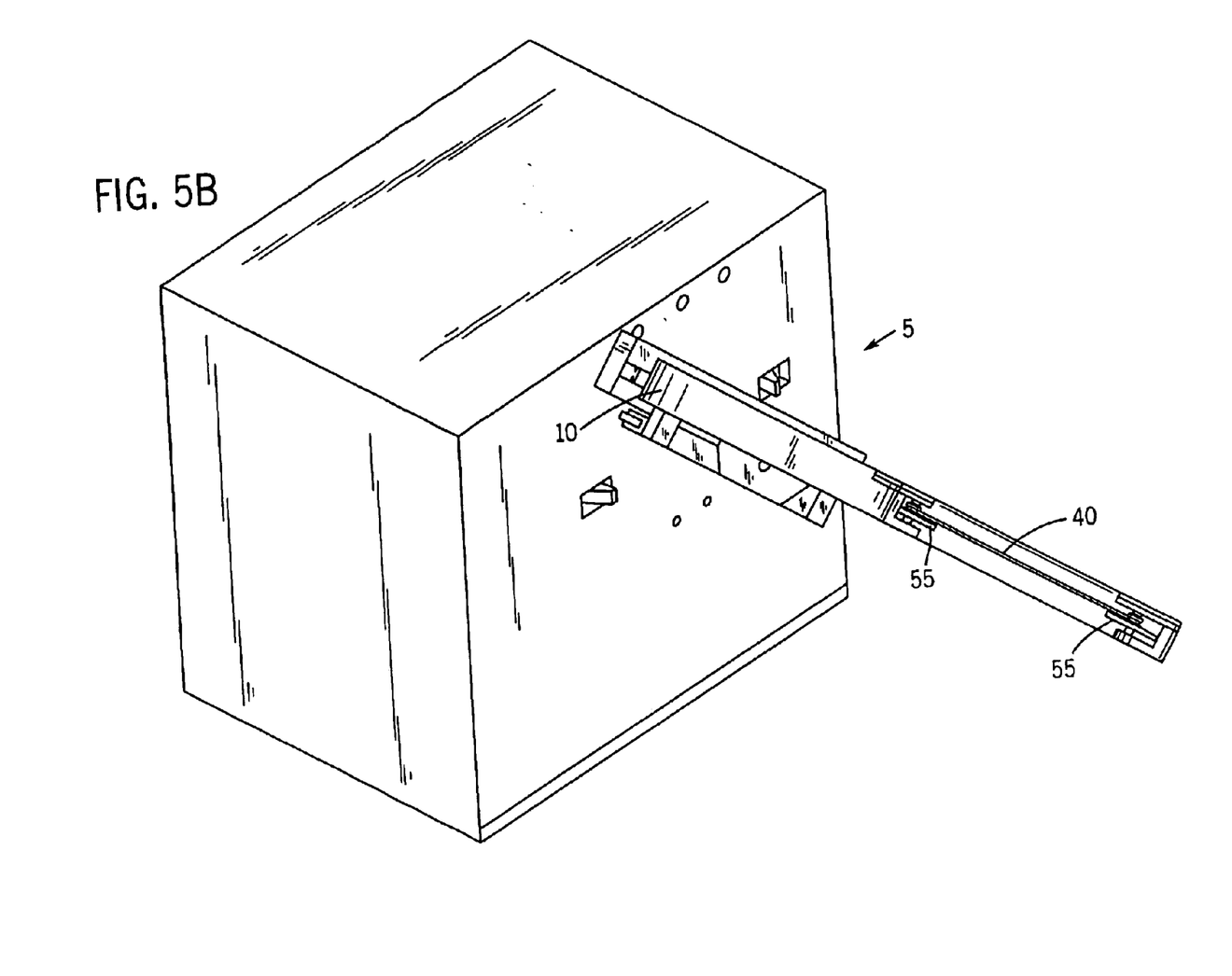
Figure 5C:
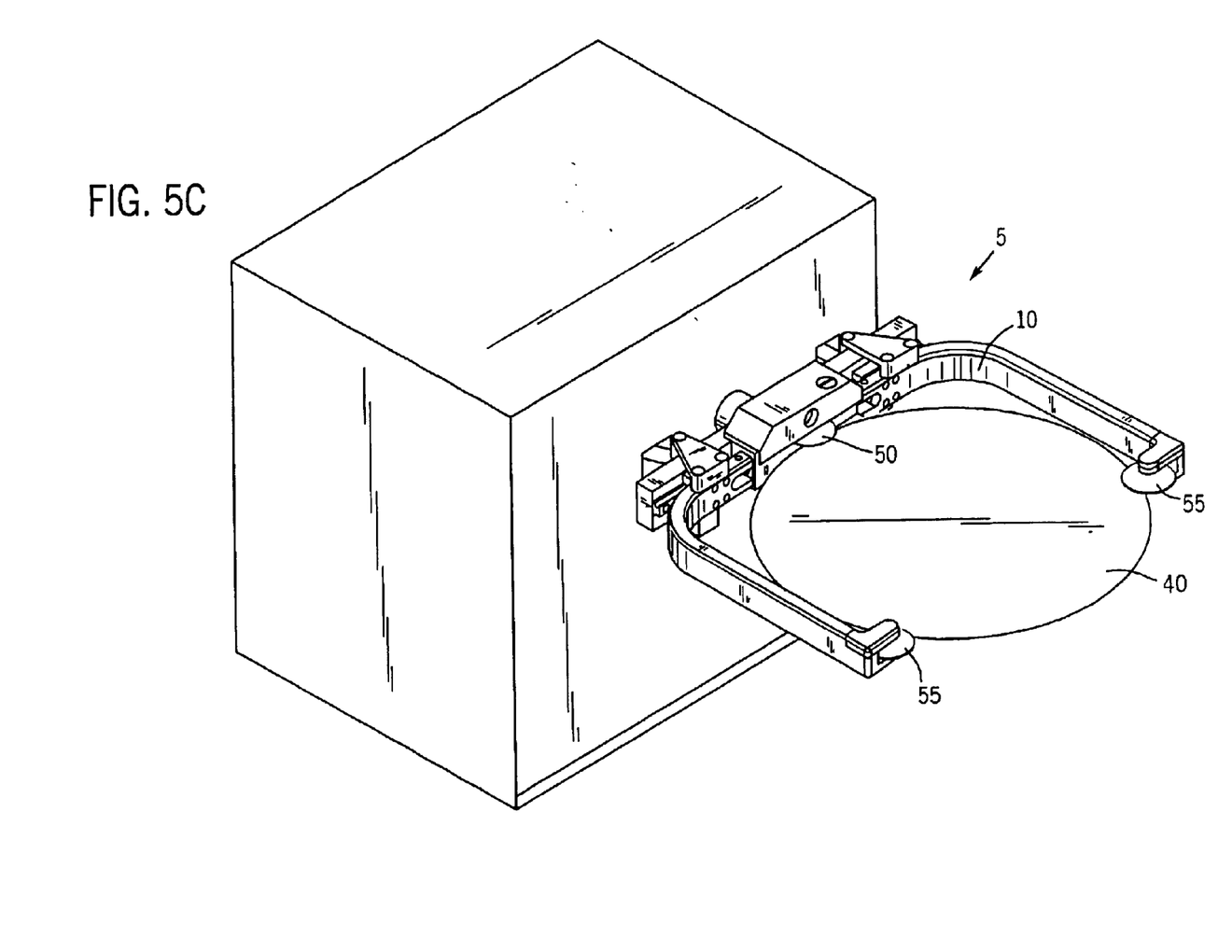

FIGS. 5A–5C illustrate a flipping sequence as the wafer holding structure 10 is rotated about axis A—A (shown in FIG. 3). FIG. 5A illustrates the wafer holding structure 10 in a position in which the semiconductor wafer 40 is parallel to the ground. The frontside of the semiconductor wafer 40 having several dies formed thereon is face-up to allow an operator to inspect the frontside of the wafer 40. FIG. 5B illustrates the wafer holding structure 10 rotated approximately 45° from its initial position. This permits an operator to inspect the semiconductor wafer 40 at an angle to detect any anomalous particles or debris which may be on the surface of the semiconductor wafer 40. FIG. 5C illustrates the wafer holding structure 10 rotated 180° from its starting point. Here, the backside of the semiconductor wafer 40 is face up which permits operators to inspect the backside of the semiconductor wafer 40. While the FIGS. 5A–5C illustrate the wafer holding structure 10 in three rotatable positions, it should be clear that an operator may rotate the wafer holding structure to any position, as permitted by the particular motors used in the apparatus 5, to facilitate inspection of the semiconductor wafer 40.

Figures 6, 6A:
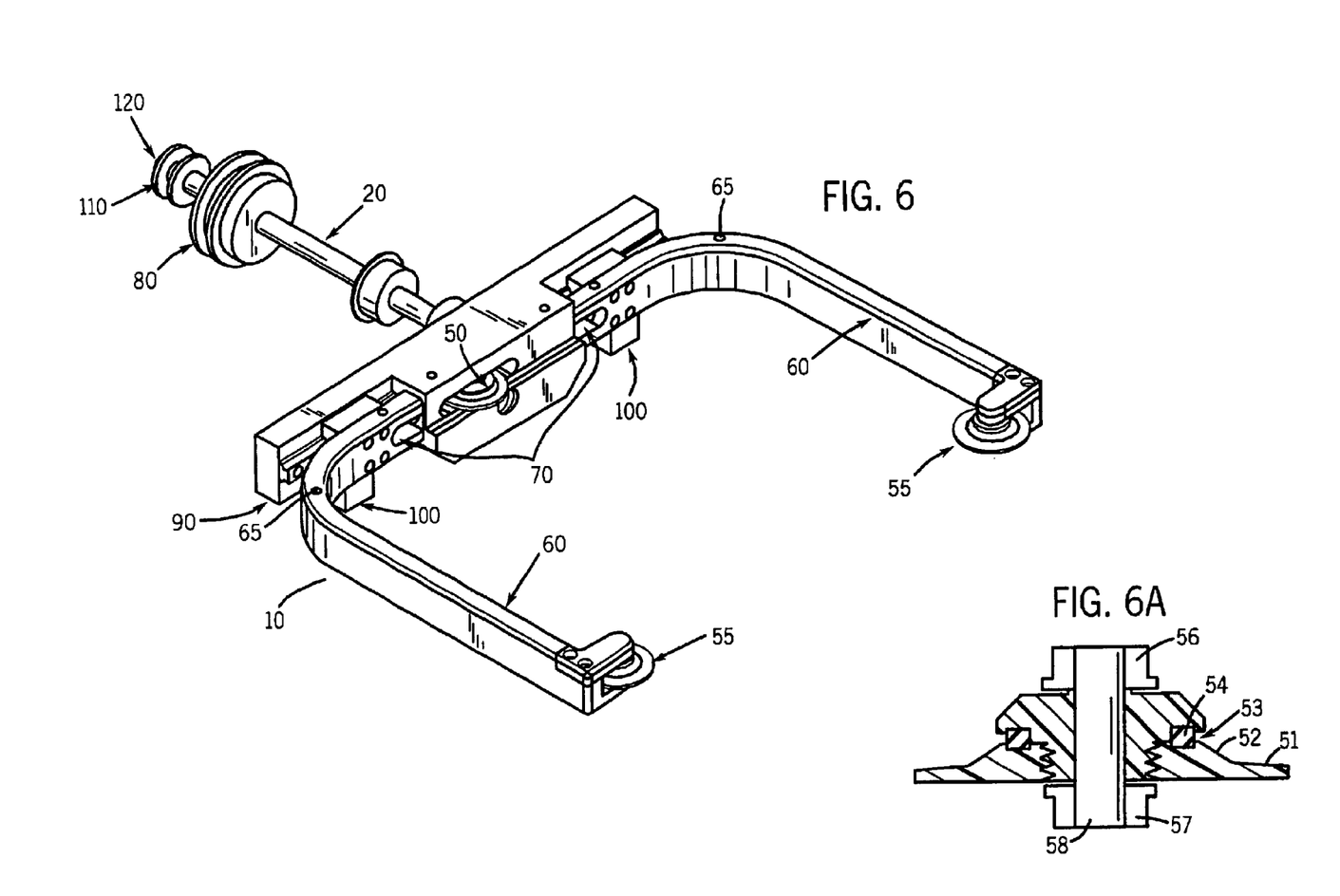
FIG. 6 illustrates a perspective view of the wafer holding structure according to one embodiment of the present invention.
FIG. 6A illustrates a cross-sectional view of the wedge assembly illustrated in FIG. 6.

FIG. 6 illustrates a more detailed view of one embodiment of the wafer holding structure 10 and the flipper shaft 20. The wafer holding structure 10 is comprised of two gripper arms 60. Each gripper arm 60 comprises two idler wheel wedge assemblies 55. The wafer holding structure 10 also comprises a drive wheel wedge assembly 50. The drive wheel wedge assembly 50 contains a slot in which to deposit a semiconductor wafer (not shown). Likewise, the idler wheel wedge assemblies 55 also contain respective slots to hold a semiconductor wafer. A semiconductor wafer is placed on the extended flat portions of the wedge assemblies 50 and 55. With the semiconductor wafer resting on the extended flat portions of the wedge assemblies 50 and 55, the gripper arms 60 are pulled together by tension springs 70. The tension springs 70 permit the gripper arms 60 to slide in a horizontal direction. The range of motion of the tension springs 70 may be advantageously limited by a stopping mechanism, such as a post, which insures that the gripper arms will only open wide enough to accommodate the largest wafers. As the tension springs 70 pull the gripper arms 60 together, the semiconductor wafer is forced upward along an incline area on the wedge assemblies 50 and 55 and into the wedge slots on the wedge assemblies 50 and 55. The pressure of the gripper arms 60 provided by the tension springs 70 and the slots in the wedge assemblies 50 and 55 work together to secure the semiconductor wafer within the wafer holding structure 10. The wedge assembly pockets contain a friction material, such as Tygon, to buffer the semiconductor wafer within the slots. Alternatively, the gripper arms 60 may be permitted to pivot about joints 65 which may also permit the opening and closing of the gripper arms to allow loading and unloading of the wafers.

A cross-sectional view of the wedge assembly 50 and 55 is illustrated in FIG. 6A. A wafer (not shown) is placed on the extended flat portion 51 of the wedge assembly 50 and 55. As the gripper arms (not shown) close about the perimeter of the wafer, the wafer is forced up the inclined portion 52 of the wedge assembly 50 and 55 and into the wedge slot 53. The wedge slot contains a friction material 54, such as Tygon, to secure the wafer within the wedge assembly 50 and 55. Bearings 56 and 57 will permit the wedge assembly 50 and 55 to rotate about the wedge shaft 58.

The drive wheel wedge assembly 50 may be coupled to a rotational drive motor (shown in FIG. 4) to provide rotation of the semiconductor wafer about an imaginary axis disposed generally perpendicular to the surface of the wafer and extending generally through the axial center of the wafer. The semiconductor wafer can be flipped by a motor belt turning the flipper drive pulley 80 which in turn rotates the hollow flipper shaft 20. A mounting head 90 locks the flipper shaft 20 to the wafer holding structure 10. Retraction mechanisms 100 may be used to prevent the gripper arms 60 of the wafer holding structure 10 from opening without the wafer being in an upright horizontal position. Once the gripper arms 60 rotate from an upright and horizontal starting position so that the retraction mechanisms 100 are pushed into a locked position within the housing of the apparatus 5. This insures that the semiconductor wafer will not accidentally be released from the wafer holding structure 10 during the inspection process. To remove the semiconductor wafer, the wafer holding structure 10 is rotated to the upright horizontal position, so that the retraction mechanisms 100 can be extended. The gripper arms 60 are opened so that the semiconductor wafer slides down the inclined portion of the wedge assemblies 50 and 55. The semiconductor wafer is then ready to be removed from the inspection apparatus 5.

As previously discussed, while the semiconductor wafer is captured by the wedge assemblies 50 and 55, it can also be rotated about an imaginary axis disposed generally perpendicular to the surface of the wafer and extending generally through the axial center of the wafer. The two idler wheel wedge assemblies 55 are forced inward by the tensioning springs 70. Since the idler wheel wedge assemblies 55 are advantageously off center of the semiconductor wafer, they force the semiconductor wafer into the drive wheel wedge assembly 50. This tension provides enough friction on the drive wheel wedge assembly 55 so that the semiconductor wafer can be driven to rotate within the confines of the wedge assemblies 50 and 55. A rotational drive pulley 110 is driven by a motor drive belt connected to a rotational drive motor which turns the rotational drive shaft 120 which may be held inside the hollow flipper shaft 20. In this embodiment, the flipper shaft 20 is a hollow shaft with an axial opening extending therethrough. This rotational drive shaft 120 then rotates the drive wheel wedge assembly 50 to rotate the semiconductor wafer about an axis disposed generally perpendicular to the surface of the wafer and extending generally through the axial center of the wafer. The motors which are connected to the rotational drive pulley 110 and the flipper drive pulley 80 which provide for the rotation of the semiconductor wafer about axis A—A and axis B—B (shown in FIG. 3), may be controlled by operators using an electromechanical device, such as a roller ball or a joy stick.

Figure 7:
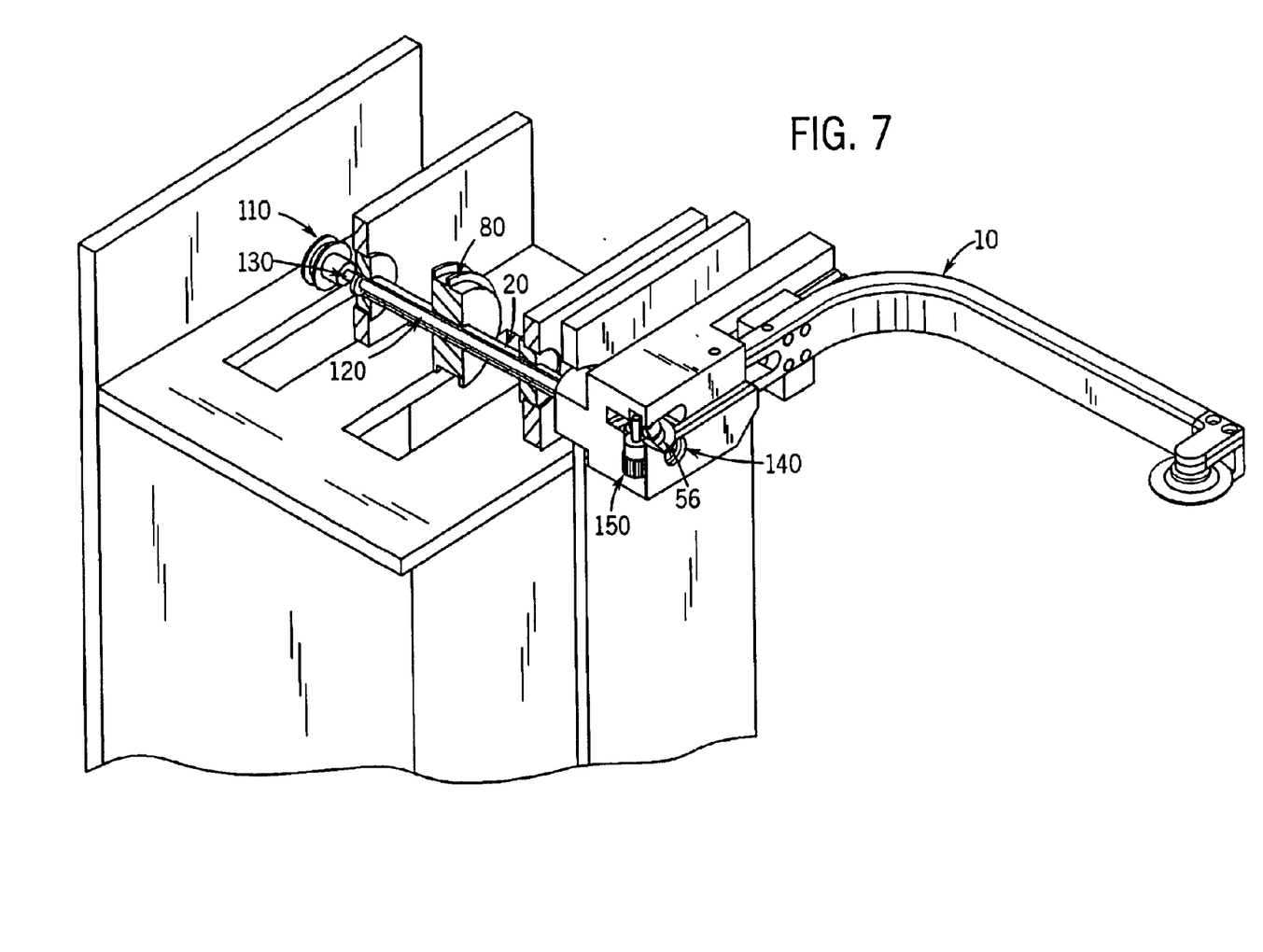
FIG. 7 illustrates a partial cross-section of the perspective view of the rotating gripper wafer flipper illustrated in FIG. 1, taken along line 5—5.

FIG. 7 illustrates a partial cross-section of the rotating gripper wafer flipper apparatus 5 illustrated in FIG. 2, taken along line 7—7. This figure is intended to illustrate one embodiment of the mechanisms used to rotate the wafer along axis A—A and axis B—B, as illustrated in FIG. 3. Beginning first with the flipper shaft system, i.e., the mechanism responsible for rotating the semiconductor wafer about the axis A—A (illustrated in FIG. 3), the apparatus 5 comprises the flipper shaft 20 and the flipper drive pulley 80. The flipper shaft pulley 54 is coupled to the flipper shaft 20 which is connected to the wafer holding structure 10. A motor driven belt attached to the flipper drive pulley 80 permits rotation of the wafer holding structure 10 about the axis A—A.

One embodiment of the mechanisms used to rotate the semiconductor wafer about the axis B—B (shown in FIG. 3) include the rotational drive shaft 120 and the rotational shaft pulley 110. The rotational drive shaft 120 may be configured to fit inside the hollow flipper shaft 20. The rotational drive shaft 120 is held inside the hollow flipper shaft 20 by rotational shaft bearings 130 which press fit inside the flipper shaft 20. The rotational drive shaft 120 is coupled to the rotational drive pulley 110. The drive pulley 110 may be coupled to a rotational motor by a motor belt (not shown) which permits rotation of the rotational drive shaft 120. The rotational drive shaft 120 is coupled to a worm gear 140. The worm gear 140 is coupled to a worm driven gear 150 which drives the drive wheel wedge assembly 50 to rotate as the rotational drive shaft 120. Both the motors used to control the flipper shaft 20 and the rotational drive shaft 120 may be coupled to tools such as a joy stick or a roller ball, which may be controlled by an operator during the inspection process.

Figure 8A:
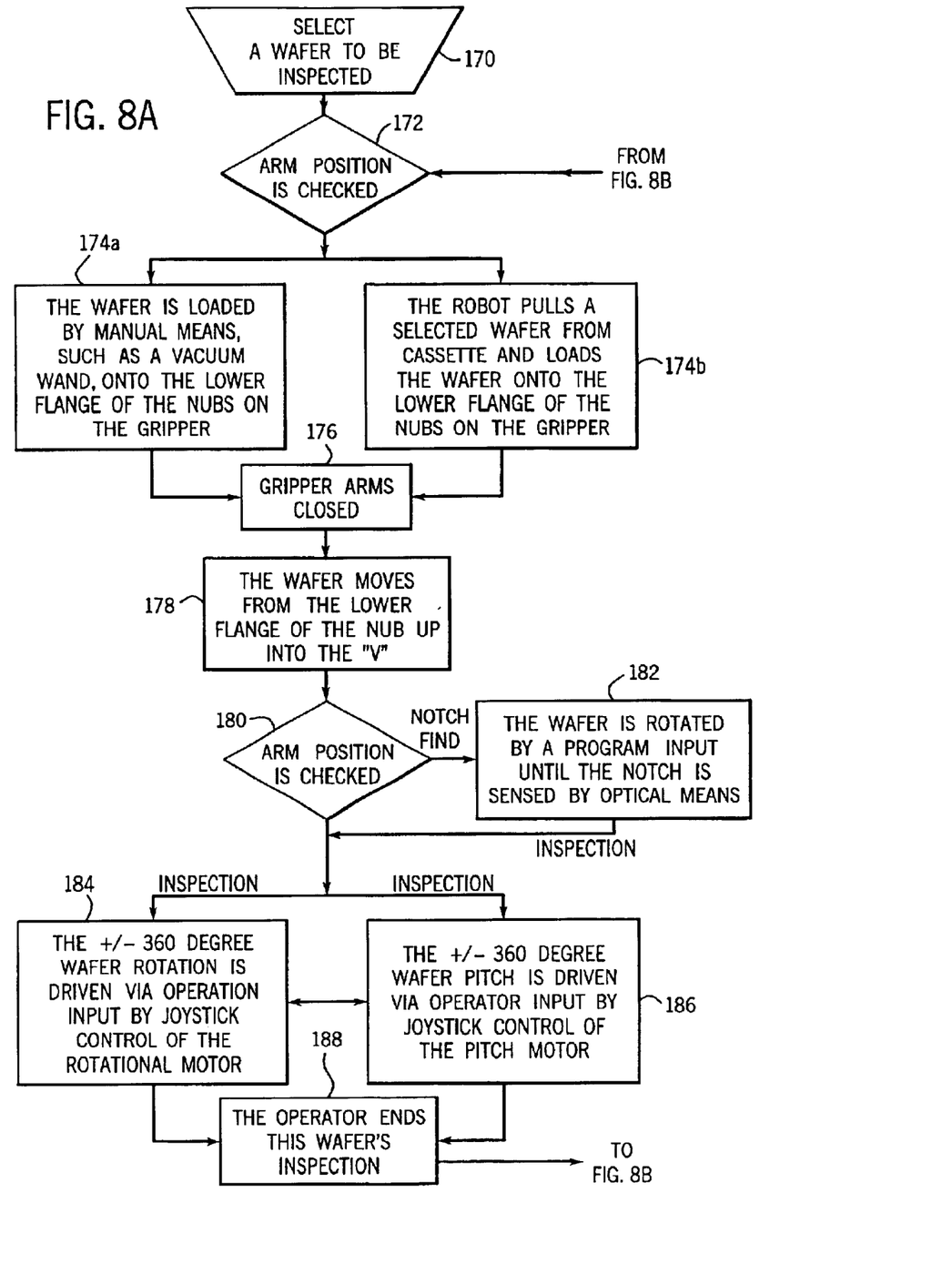
FIG. 8 illustrates a flow chart of an inspection process according to the present invention.
Figure 8B:
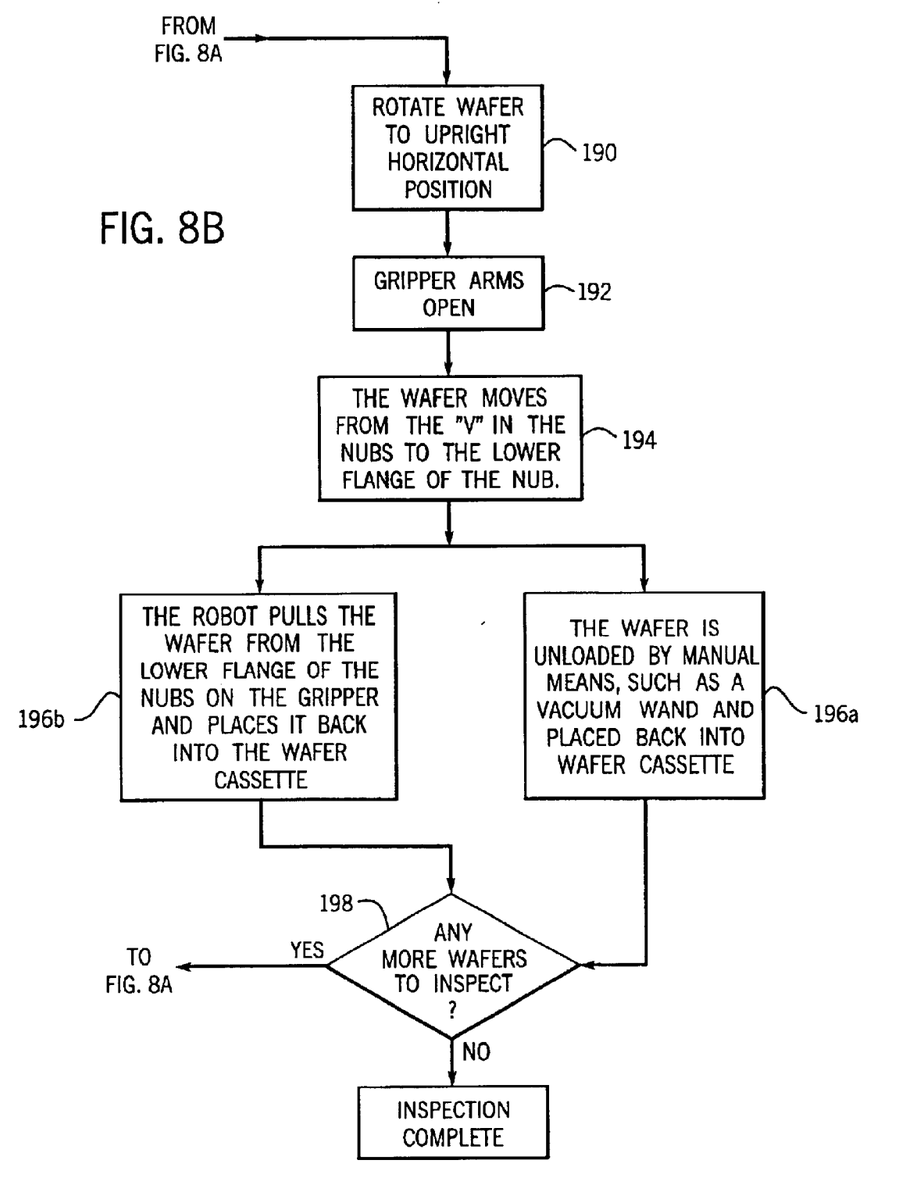

FIG. 8 illustrates a flow chart of the inspection process. First, the operator selects a wafer to be inspected, (Step 170). Next, an optical sensor in the inspection station checks the position of the wafer holding structure, (Step 172). That is to say, a sensor may be used to insure that the wafer holding structure is in an upright horizontal position such that it may receive a wafer. If the arms are not in an upright horizontal position, a wafer may not be loaded into the inspection system. If the arm position is upright and horizontal, a wafer can be loaded onto the wafer loading structure so that the wafer is placed on the lower flange of the wedge assemblies. The wafer may be loaded manually using a vacuum wand. (Step 174A). Alternately, a robotic arm proximately positioned next to the inspection station may be used to deposit the wafer onto the wafer holding structure. (Step 174B). Next, the gripper arms are closed. (Step 176). As the retraction mechanisms are retracted, the wafer moves from the lower flange, up the inclined portion of the wedge assemblies, and into the v-shaped slots in the wedge assemblies. (Step 178). At this point, the arm position may be checked again. (Step 180). In one embodiment, the inspection apparatus contains an optical sensor which is configured to locate a notch on the frontside of the wafer to begin the inspection process with the wafer in a predetermined position. Thus, the wafer may be rotated until the optical sensor senses a notch in the wafer. (Step 182). Next, the inspection of the wafer begins.

To inspect the wafer completely, the wafer may be rotated, plus or minus 360° for example, about an axis disposed generally perpendicular to the surface of the wafer and extending generally through the axial center of the wafer. The rotation of the wafer may be driven by operator input, using a joy stick, for example, to control the rotational motor. (Step 184). During the inspection process, an operator may inspect the wafer at various angles and also inspect the backside of the wafer. Thus, the wafer may be rotated about the flipper shaft (illustrated in FIGS. 2–7). The rotation of the wafer about the flipper shaft may be driven by operator input using a joy stick to control the pitch motor. (Step 186). Step 184 and Step 186 are iterated until the inspection of the wafer is complete, and the operator ends the wafer inspection. (Step 188).

The wafer is rotated to its upright horizontal position. (Step 190). The gripper arms are then opened. (Step 192) and the wafer slides down the inclined surfaces and on to the lower flanges of the wedge assemblies. (Step 194). At this point, the wafer is removed from the wafer holding structure either manually, by use of a vacuum wand or similar apparatus for example (Step 196A), or automatically using a robot arm for example. (Step 196B). Finally, if there are more wafers to be inspected, the process returns to Step 172 and the inspection process can begin again. (Step 198). Otherwise, the inspection is complete.

While the invention may be susceptible to various modifications and alternative forms, specific embodiments have been shown by way of example in the drawings and have been described in detail, herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An apparatus for inspecting a disc-like substrate comprising a holding structure having members arranged to hold and rotate the substrate about a first axis, the holding structure being coupled to a rotatable member, the rotatable member configured to rotate the holding structure about a second axis different from the first axis.

2. The apparatus, as set forth in claim 1, wherein the members comprise a plurality of wedge assemblies configured to rotate the substrate about the first axis.

3. The apparatus, as set forth in claim 1, wherein the first axis is disposed generally perpendicular to a flat surface of the substrate and extends generally through an axial center of the substrate.

4. The apparatus, as set forth in claim 1, wherein the holding structure comprises two L-shaped gripping arms arranged to form a single U-shaped structure and configured to hold the substrate substantially parallel to the gripping arms.

5. The apparatus, as set forth in claim 4, wherein the U-shaped structure is configured to open and close about the perimeter of the substrate.

6. The apparatus, as set forth in claim 5, further comprising tensioning springs configured to permit the U-shaped structure to open and close about the perimeter of the substrate.

7. The apparatus, as set forth in claim 2, wherein the holding structure comprises three wedge assemblies, at least one wedge assembly coupled to a motor and configured to rotate the substrate about the first axis disposed generally perpendicular to a flat surface of the substrate and extending generally through an axial center of the substrate.

* * * * *